(12) United States Patent
Barot et al.

(10) Patent No.: US 12,381,553 B2
(45) Date of Patent: Aug. 5, 2025

(54) INTEGRATED CIRCUIT WITH BONDWIRE FAULT DETECTION CIRCUIT

(71) Applicant: TEXAS INSTRUMENTS INCORPORATED, Dallas, TX (US)

(72) Inventors: Kashyap Barot, Bengaluru (IN); Kumar Anurag Shrivastava, Bengaluru (IN); Sreeram Nasum S, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 133 days.

(21) Appl. No.: 18/194,289

(22) Filed: Mar. 31, 2023

(65) Prior Publication Data

US 2024/0195412 A1  Jun. 13, 2024

(30) Foreign Application Priority Data

Dec. 13, 2022  (IN) .............................. 202241071827

(51) Int. Cl.
*H03K 17/687*  (2006.01)
*G01R 31/58*  (2020.01)

(52) U.S. Cl.
CPC ......... *H03K 17/6874* (2013.01); *G01R 31/58* (2020.01)

(58) Field of Classification Search
CPC ........ G01R 31/50; G01R 31/52; G01R 31/54; G01R 31/56; G01R 31/58; G01R 31/66; H03K 17/51; H03K 17/56; H03K 17/687; H03K 17/6871; H03K 17/6874
See application file for complete search history.

(56) References Cited

U.S. PATENT DOCUMENTS

| | | | |
|---|---|---|---|
| 2001/0019169 A1* | 9/2001 | Marino | G01R 31/2853 257/E23.033 |
| 2002/0130158 A1* | 9/2002 | Boller | H01L 21/67288 228/103 |
| 2018/0017612 A1* | 1/2018 | Burton-Ccoca | G01K 7/01 |
| 2019/0242940 A1* | 8/2019 | Michallick | G01R 31/2853 |
| 2019/0295953 A1* | 9/2019 | Xie | H01L 25/0657 |
| 2019/0369151 A1* | 12/2019 | Meiser | G01R 31/58 |
| 2021/0318375 A1* | 10/2021 | Lee | G01R 31/2608 |

* cited by examiner

*Primary Examiner* — Huy Q Phan
*Assistant Examiner* — David B Frederiksen
(74) *Attorney, Agent, or Firm* — Mandy Barsilai Fernandez; Frank D. Cimino

(57) ABSTRACT

A circuit includes a switch and a switch controller. The switch has a first terminal coupled to a voltage supply terminal, a second terminal coupled to a ground terminal and to a first bondwire terminal. The switch controller includes: a first resistor, a second resistor, a capacitor, and a buffer circuit. The first resistor has a first terminal coupled to a second bondwire terminal. The second resistor has a first terminal coupled to the voltage supply terminal and has a second terminal coupled to a second terminal of the first resistor. The capacitor has a first terminal coupled to the ground terminal and to the first bondwire terminal and has a second terminal coupled to second terminals of the first and second resistors. The buffer circuit has a terminal coupled to the second terminal of the capacitor and has an output terminal coupled to the control terminal of the switch.

20 Claims, 4 Drawing Sheets

INTEGRATED CIRCUIT WITH BONDWIRE FAULT DETECTION CIRCUIT

CROSS REFERENCE TO RELATED APPLICATION

The present application is related to: India Provisional Application No. 202241071827, titled "Missing Bond-wire detect circuit for Isolated Transformer based communication channel", filed on Dec. 13, 2022, which is hereby incorporated by reference in its entirety.

BACKGROUND

Bondwires are used to couple integrated circuits pads to package pins and/or external components. If a bondwire is missing or otherwise faulty, the related integrated circuit may still have functionality, but the functionality of the related package or system may be limited. As an example, a multi-chip module (MCM) may include a transmitter, a transformer, and a receiver on separate dies. If one or more bondwires of the MCM is missing or faulty, system level issues such as radiated immunity, radiated emission, common mode transient immunity, and/or common mode noise may occur. Detection of such issues or related bondwire faults are difficult.

SUMMARY

In an example, a circuit includes a switch and a switch controller. The switch has first and second terminals and a control terminal. The first terminal of the switch is coupled to a voltage supply terminal. The second terminal of the switch is coupled to a ground terminal and to a first bondwire terminal. The switch controller includes: a first resistor; a second resistor; a capacitor; and a buffer circuit. The first resistor has a first terminal and a second terminal. The first terminal of the first resistor is coupled to a second bondwire terminal. The second resistor has a first terminal and a second terminal. The first terminal of the second resistor is coupled to the voltage supply terminal. The second terminal of the second resistor is coupled to the second terminal of the first resistor. The capacitor has a first terminal and a second terminal. The first terminal of the capacitor is coupled to the ground terminal and to the first bondwire terminal. The second terminal of the capacitor is coupled to the second terminals of the first and second resistors. The buffer circuit has first, second, and third terminals and an output terminal. The first terminal of the buffer circuit is coupled to the voltage supply terminal. The second terminal of the buffer circuit is coupled to the second terminals of the capacitor and the first and second resistors. The third terminal of the buffer circuit is coupled to the ground terminal and to the first bondwire terminal. The output terminal of the buffer circuit is coupled to the control terminal of the switch.

In another example, a circuit includes: a first switch; a first switch controller; a second switch; and a second switch controller. The first switch has first and second terminals and a control terminal. The first terminal of the first switch is coupled to a voltage supply terminal. The second terminal of the first switch is coupled to a ground terminal and to a first bondwire terminal. The first switch controller includes: a first resistor; a second resistor; a first capacitor; and a first buffer circuit. The first resistor has a first terminal and a second terminal. The first terminal of the first resistor is coupled to a second bondwire terminal. The second resistor has a first terminal and a second terminal. The first terminal of the second resistor is coupled to the voltage supply terminal. The second terminal of the second resistor is coupled to the second terminal of the first resistor. The first capacitor has a first terminal and a second terminal. The first terminal of the first capacitor is coupled to the ground terminal and to the first bondwire terminal. The second terminal of the first capacitor is coupled to the second terminals of the first and second resistors. The first buffer circuit has first, second, and third terminals and an output terminal. The first terminal of the first buffer circuit is coupled to the voltage supply terminal. The second terminal of the first buffer circuit is coupled to the second terminals of the first capacitor and the first and second resistors. The third terminal of the first buffer circuit coupled to the ground terminal and to the first bondwire terminal. The output terminal of the first buffer circuit coupled to the control terminal of the first switch. The second switch has first and second terminals and a control terminal. The first terminal of the second switch is coupled to the voltage supply terminal. The second terminal of the second switch is coupled to the ground terminal and to the first bondwire terminal. The second switch controller includes: a third resistor; a fourth resistor; a second capacitor; and a second buffer circuit. The third resistor has a first terminal and a second terminal. The first terminal of the third resistor is coupled to a third bondwire terminal. The fourth resistor has a first terminal and a second terminal. The first terminal of the fourth resistor is coupled to the voltage supply terminal. The second terminal of the fourth resistor is coupled to the second terminal of the first third. The second capacitor has a first terminal and a second terminal. The first terminal of the second capacitor is coupled to the ground terminal and to the first bondwire terminal. The second terminal of the second capacitor is coupled to the second terminals of the third and fourth resistors. The second buffer circuit has first, second, and third terminals and an output terminal. The first terminal of the second buffer circuit is coupled to the voltage supply terminal. The second terminal of the second buffer circuit is coupled to the second terminals of the second capacitor and the third and fourth resistors. The third terminal of the second buffer circuit is coupled to the ground terminal and to the first bondwire terminal. The output terminal of the second buffer circuit is coupled to the control terminal of the second switch.

In yet another example, a circuit includes: a switch having a control terminal; and a switch controller having a first terminal, a second terminal, and a switch controller output. The switch controller output is coupled to the control terminal. The switch controller is configured to: receive a power supply voltage at the first terminal; receive a current having passed through an external component, the current having a current level responsive to the power supply voltage and to a condition of a bondwire coupled to the external component and to the switch controller; and provide a control signal at the switch controller output responsive to the current level.

DETAILED DESCRIPTION

Figure 1:
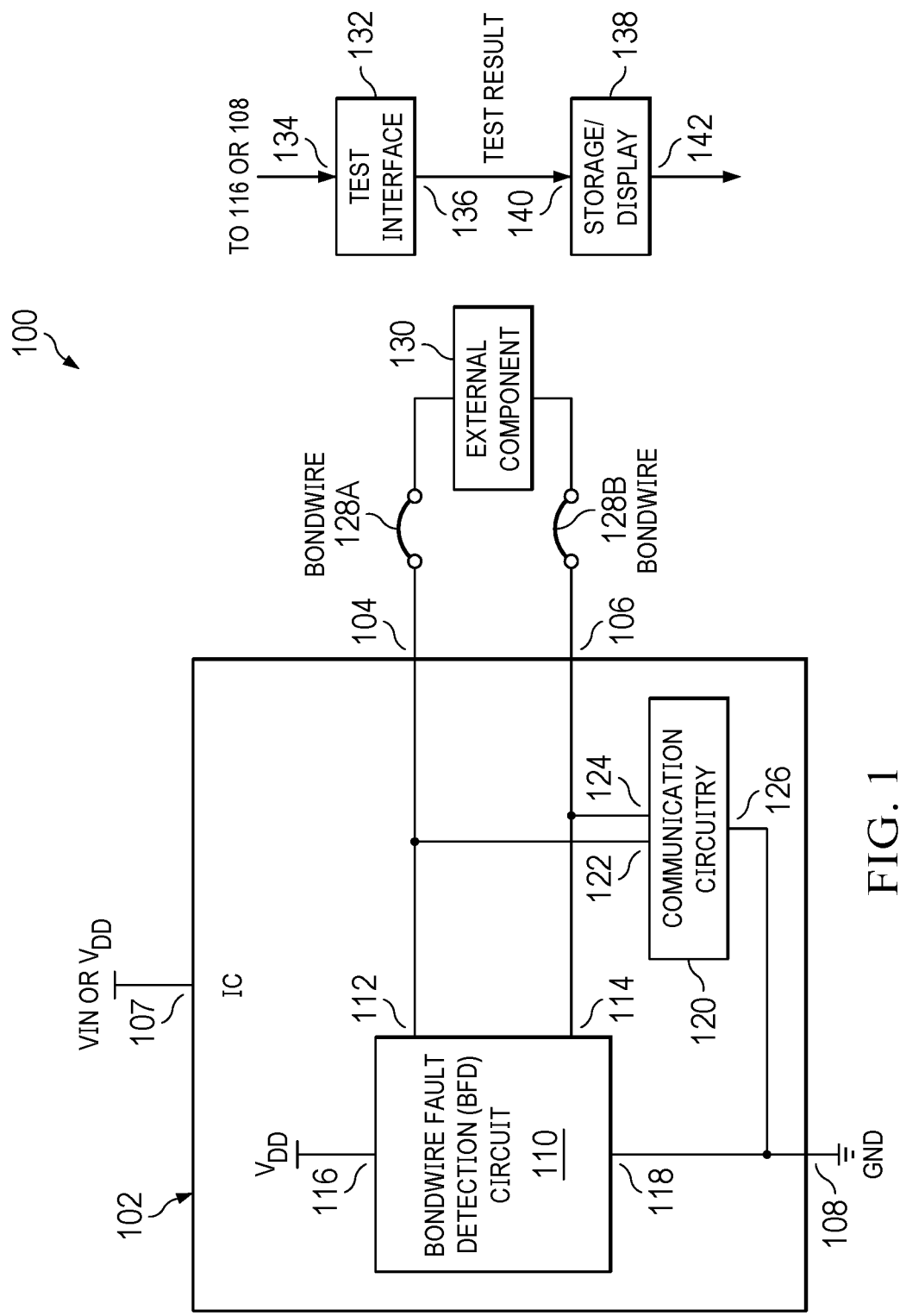
FIG. 1 is a diagram showing an example testing environment including a device under test (DUT) with a bondwire fault detection (BFD) circuit.

The same reference numbers or other reference designators are used in the drawings to designate the same or similar features. Such features may be the same or similar either by function and/or structure.

Described herein are integrated circuits (IC) that include one or more bondwire fault detection (BFD) circuits. When an IC or related device is under test, each BFD circuit operates to detect whether one or more bondwires between pads of the IC and terminals of an external component are missing or faulty. At the time of the test, the IC may be an unpackaged product (i.e., a die), a packaged product, part of a multi-chip-module (MCM), or another arrangement. Regardless of the particular arrangement of the IC, the test and BFD circuits enable detection of missing or faulty bondwires.

During the test, a test interface may provide a test signal to the BFD circuit. The test interface may be external to the IC or internal to the IC. Responsive to the test signal, each BFD circuit provides a bondwire fault signal that indicates whether there is a bondwire fault. The bondwire fault signal result may be stored for later use and/or may be used to display a bondwire fault status. In some examples, detection of a bondwire fault results in the related IC, package, or system being disposed of. In other examples, detection of a bondwire fault results in the related IC, package, or system being repaired. In some examples, each BFD circuit is in parallel with other IC circuitry. Without limitation, IC circuitry that may be in parallel with a BFD circuit includes transmitter circuitry and/or receiver circuitry.

FIG. 1 is a diagram showing an example testing environment 100 that includes an example device under test (DUT). The testing environment 100 includes an IC 102 (the example DUT), an external component 130, a test interface 132, and a storage/display unit 138. In some examples, the external component 130 is an inductor. In other examples, the external component 130 is a resistor. The storage/display unit 138 may include a memory, a graphical user interface (GUI), and/or other units to store or display test results. In some examples, the test interface 132 and the storage/display unit 138 are part of an external test interface such as an automatic test equipment (ATE). In some examples, the test interface 132 and the storage/display unit 138 include circuitry of the IC 102.

As shown, the IC 102 has a first terminal 104, a second terminal 106, a third terminal 107, and a ground terminal 108. The IC 102 includes a BFD circuit 110 and communication circuitry 120. The BFD circuit 110 has a first terminal 112, a second terminal 114, a third terminal 116, and a ground terminal 118. The communication circuitry 120 has a first terminal 122, a second terminal 124, and a ground terminal 126. In different examples, the communication circuitry 120 includes receiver circuitry, transmitter circuitry, transceiver circuitry, and/or other communication circuitry. The external component 130 has a first terminal and a second terminal. The test interface 132 has an input 134 and an output 136. The storage/display unit 138 has an input 140 and an output 142. The terminal 107 of the IC 102 may be an input terminal that receives an input voltage VIN from a device external to the IC 102, in an example, to convert to $V_{DD}$ using an internal voltage regulator (not shown) of the IC 102. Alternatively, the terminal 107 of the IC 102 is a supply voltage terminal, at which a supply voltage $V_{DD}$ is received from a voltage supply (not shown). The terminal 116 of the BFD circuit 110 is coupled to a supply voltage terminal (e.g., 107 in one example) to receive the supply voltage $V_{DD}$. The ground terminal 118 of the BFD circuit 110 and the ground terminal 126 of the communication circuitry 120 are coupled to the ground terminal 108 of the IC 102 to be electrically grounded.

In the example of FIG. 1, the first terminal of the external component 130 is coupled to the first terminal 104 of the IC 102 via a first bondwire 128A. The second terminal of the external component 130 is coupled to the second terminal 106 of the IC 102 via a second bondwire 128B. The first terminal 112 of the BFD circuit 110 is coupled to the first terminal 104 of the IC 102. The second terminal 114 of the BFD circuit 110 is coupled to the second terminal 106 of the IC 102. In some examples, the third terminal 116 of the BFD circuit 110 is coupled to third terminal 107 of the IC 102. In other examples, the IC 102 includes a voltage regulator (not shown) between the third terminal 107 of the IC 102 and the third terminal 116 of the BFD circuit 110. The ground terminal 118 of the BFD circuit 110 is coupled to the ground terminal 108 of the IC 102. The first terminal 122 of the communication circuitry 120 is coupled to the first terminal 104 of the IC 102. The second terminal 124 of the communication circuitry 120 is coupled to the second terminal 106 of the IC 102. The ground terminal 126 of the communication circuitry 120 is coupled to the ground terminal 108 of the IC 102. In other words, the communication circuitry 120 is coupled in parallel with the BFD circuit 110.

In different examples, the input 134 of the test interface 132 may be coupled to the third terminal 107 of the IC 102, the third terminal 116 of the BFD circuit 110, the ground terminal 108 of the IC 102, or the ground terminal 118 of the BFD circuit 110. The output 136 of the test interface 132 is coupled to the input 140 of the storage/display unit 138. The output 142 of the storage/display unit 138 enables test results to be accessed by a user or processing system. In some examples, the output 142 of the storage/display unit 138 may be omitted.

The test related to the IC 102 DUT is performed after the bondwires 128A and 128B are presumed to be in their respective positions. In some examples, the test interface 132 operates to: receive an amount of current flow at the third terminal 116 or the ground terminal 118 at its input 134 while $V_{DD}$ or a test signal is applied to the third terminal 116 of the BFD circuit 110; if the amount of current flow is less than a threshold, identify that there is no bondwire fault; if the amount of current flow is greater than the threshold, identify that there is a bondwire fault; and provide a test result at its output 136. In some examples, the test result is a bondwire fault signal that has a first state (e.g., a logical high or "1" state) when a bondwire fault is detected and that has second state (e.g., a logical low or "0" state) when no bondwire fault is detected. In some examples, the storage/display unit 138 operates to: receive the test result at its input 140; and provide the test result or a related indicator at its output 142. The operations of the storage/display unit 138 may be automatic, based on a schedule, or based on inquiry from a test administrator.

With the BFD circuit 110 and the operations of the test interface 132, detection of bondwire faults is facilitated. If no bondwire fault is detected, the IC 102 or related device may be subject to further tests (e.g., to test the communication circuitry 120). In some examples, testing of the communication circuitry 120 and bondwire fault testing are performed by the test interface 132. Once all tests are completed and indicate proper functionality, the IC 102 and related device may be sorted as a functional device for inventory. If a bondwire fault is detected, the IC 102 or related device may be subject to further tests, may be subject to repair, or may be discarded.

Figure 2:
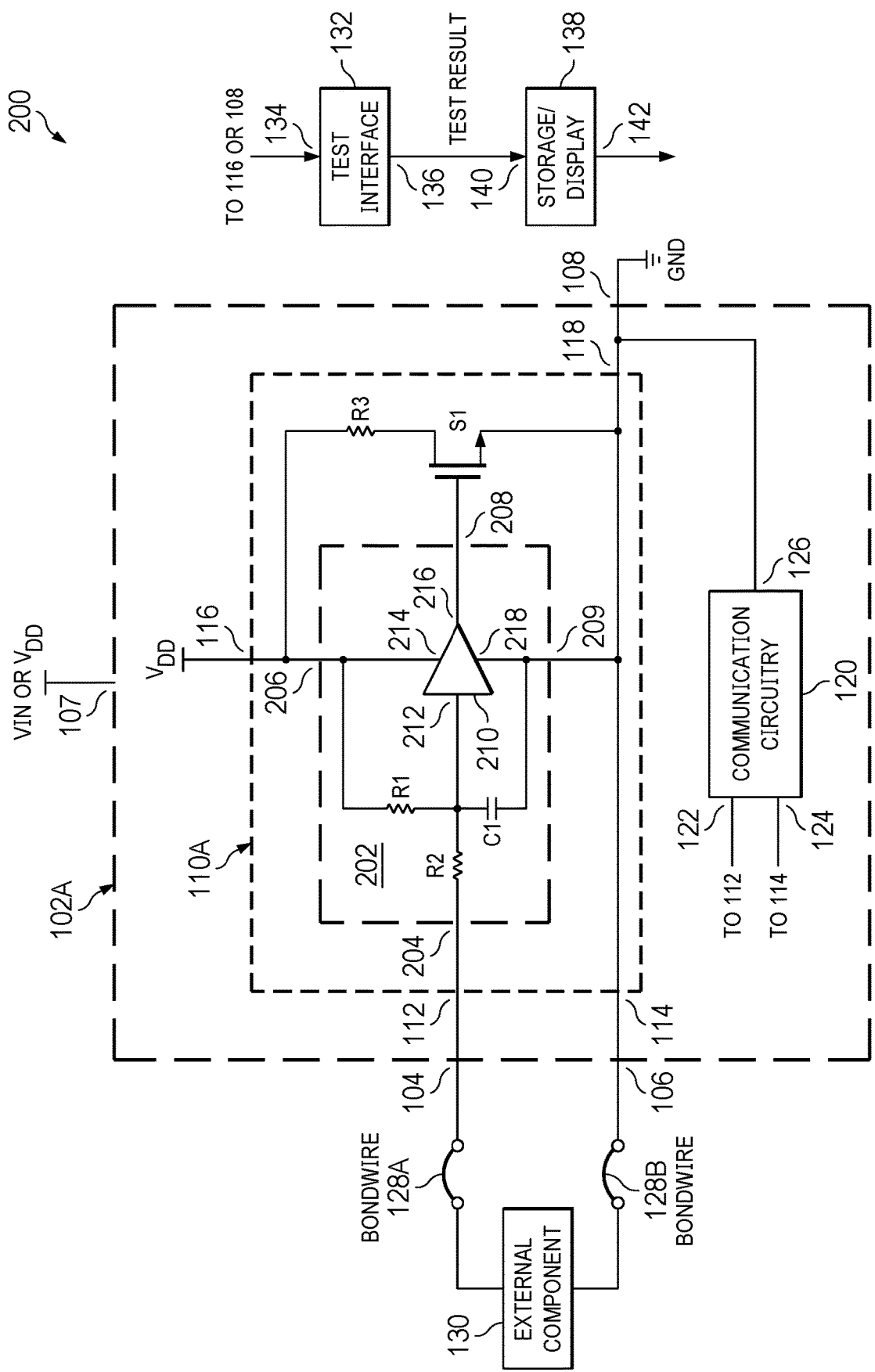
FIG. 2 is a diagram showing another example testing environment including a DUT with a BFD circuit.

FIG. 2 is a diagram showing an example testing environment 200 that includes an example DUT. The testing environment 200 includes an IC 102A (the example DUT), the external component 130, the test interface 132, and the storage/display unit 138. The IC 102A is an example of the IC 102 in FIG. 1. The external component 130, the test interface 132, and the storage/display unit 138 were described in FIG. 1 and have the same description in FIG. 2.

In the example of FIG. 2, the IC 102A has the first terminal 104, the second terminal 106, the third terminal 107, and the ground terminal 108. The IC 102A includes a BFD circuit 110A and communication circuitry 120. The BFD circuit 110A, the communication circuitry 120, the external component 130, the test interface 132, the storage/display unit 138 have respective terminals, inputs, or outputs as described in FIG. 1. In different examples, the communication circuitry 120 may include receiver circuitry, transmitter circuitry, transceiver circuitry, and/or other communication circuitry.

In the example of FIG. 2, the first terminal of the external component 130 is coupled to the first terminal 104 of the IC 102A via the first bondwire 128A. The second terminal of the external component 130 is coupled to the second terminal 106 of the IC 102A via the second bondwire 128B. The first terminal 112 of the BFD circuit 110A is coupled to the first terminal 104 of the IC 102A. The second terminal 114 of the BFD circuit 110A is coupled to the second terminal 106 of the IC 102A. In some examples, the third terminal 116 of the BFD circuit 110A is coupled to third terminal 107 of the IC 102A. In other examples, the IC 102A includes a voltage regulator (not shown) between the third terminal 107 of the IC 102A and the third terminal 116 of the BFD circuit 110A. The ground terminal 118 of the BFD circuit 110A is coupled to the ground terminal 108 of the IC 102A. The first terminal 122 of the communication circuitry 120 is coupled to the first terminal 104 of the IC 102A. The second terminal 124 of the communication circuitry 120 is coupled to the second terminal 106 of the IC 102A. The ground terminal 126 of the communication circuitry 120 is coupled to the ground terminal 108 of the IC 102A. In other words, the communication circuitry 120 is coupled in parallel with the BFD circuit 110A.

In different examples, the input 134 of the test interface 132 may be coupled to the third terminal 107 of the IC 102A, the third terminal 116 of the BFD circuit 110A, the ground terminal 108 of the IC 102A, or the ground terminal 118 of the BFD circuit 110A. The output 136 of the test interface 132 is coupled to the input 140 of the storage/display unit 138. The output 142 of the storage/display unit 138 enables test results to be accessed by a user or processing system. In some examples, the output 142 of the storage/display unit 138 may be omitted.

In the example of FIG. 2, the BFD circuit 110A includes a switch S1 and a switch controller 202. The switch controller 202 has a first terminal 204, a second terminal 206, an output 208, and a ground terminal 209. In some examples, the switch controller 202 includes resistors R1 and R2, a capacitor C1, and a buffer circuit 210 in the arrangement shown. Each of the resistors R1 and R2, and the capacitor C1 has a first terminal and a second terminal. The buffer circuit 210 has a first terminal 212, a second terminal 214, an output 216, and a ground terminal 218.

In some examples, the first terminal of the resistor R1 is coupled to the second terminal 206 of the switch controller 202. The second terminal of the resistor R1 is coupled to the first terminal of the capacitor C1 and the first terminal 212 of the buffer circuit 210. The second terminal of the capacitor C1 is coupled to the ground terminal 209 of the switch controller 202. The first terminal of the resistor R2 is coupled to the first terminal 204 of the switch controller 202. The second terminal of the resistor R2 is coupled to the first terminal of the capacitor C1 and the first terminal 212 of the buffer circuit 210. The second terminal 214 of the buffer circuit 210 is coupled to the second terminal 206 of the switch controller 202. The output 216 of the buffer circuit 210 is coupled to the output 208 of the switch controller 202. The ground terminal 218 of the buffer circuit 210 is coupled to the ground terminal 209 of the switch controller 202.

In some examples, the BFD circuit 110A includes a resistor R3 between the third terminal 116 of the BFD circuit 110A and the switch S1. In the example of FIG. 2, the resistor R3 has a first terminal and a second terminal. The switch S1 has a first (current) terminal, a second (current) terminal, and a control terminal. As shown, the first terminal of the resistor R3 is coupled to the third terminal 116 of the BFD circuit 110A. The second terminal of the resistor R3 is coupled to the first current terminal of the switch S1. The second current terminal of the switch S1 is coupled to the ground terminal 118 of the BFD circuit 110A. The control terminal of the switch S1 is coupled to the output 208 of the switch controller 202. In some examples, the resistor R3 is omitted. In the example of FIG. 2, the switch S1 is implemented by a field-effect transistor (FET) and, in particular, an n-channel metal-oxide semiconductor FET.

The test related to the IC 102A is performed after the bondwires 128A and 128B are presumed to be in their respective positions. In some examples, the test interface 132 operates to: receive an amount of current flow at the third terminal 116 or the ground terminal 118 at its input 134 while $V_{DD}$ or a test signal is applied to the third terminal 116 of the BFD circuit 110; if the amount of current flow is less than a threshold, identify that there is no bondwire fault; if the amount of current flow is greater than the threshold, identify that there is a bondwire fault; and provide a test result at its output 136. In some examples, the test result is a bondwire fault signal that has a first state (e.g., a logical high or "1" state) when a bondwire fault is detected and that has second state (e.g., a logical low or "0" state) when no bondwire fault is detected. In some examples, the storage/display unit 138 operates to: receive the test result at its input 140; and provide the test result or a related indicator at its output 142. The operations of the storage/display unit 138 may be automatic, based on a schedule, or based on inquiry from a test administrator.

In some examples, the switch controller 202 operates to: receive $V_{DD}$ or a test signal at its second terminal 206; provide a second voltage at the first terminal 212 of the buffer circuit 210 if the bondwires 128A and 128B are in position and not faulty; provide a signal having a second state (e.g., a logical low or "0" state) at the output 216 of the buffer circuit 210 responsive to the second voltage; maintain the switch S1 off based on the signal at the output 216 of the buffer circuit 210 having the second state. When the switch S1 is turned off, current does not flow from the third terminal 116 of the BFD circuit 110A to the ground terminal 118 via the switch S1. The test interface 132 interprets less than the threshold amount of current flow through the switch S1 or limited current flow at the third terminal 116 or the ground terminal 118 as an indicator that there is no bondwire fault.

With the BFD circuit 110A and the operations of the test interface 132, detection of bondwire faults is facilitated. If no bondwire fault is detected, the IC 102A or related device may be subject to further tests (e.g., to test the communication circuitry 120). In some examples, testing of the communication circuitry 120 and bondwire fault testing are performed by the test interface 132. Once all tests are completed and indicate proper functionality, the IC 102A and related device may be sorted as a functional device for inventory. If a bondwire fault is detected, the IC 102A or related device may be subject to further tests, may be subject to repair, or may be discarded.

Figure 3:
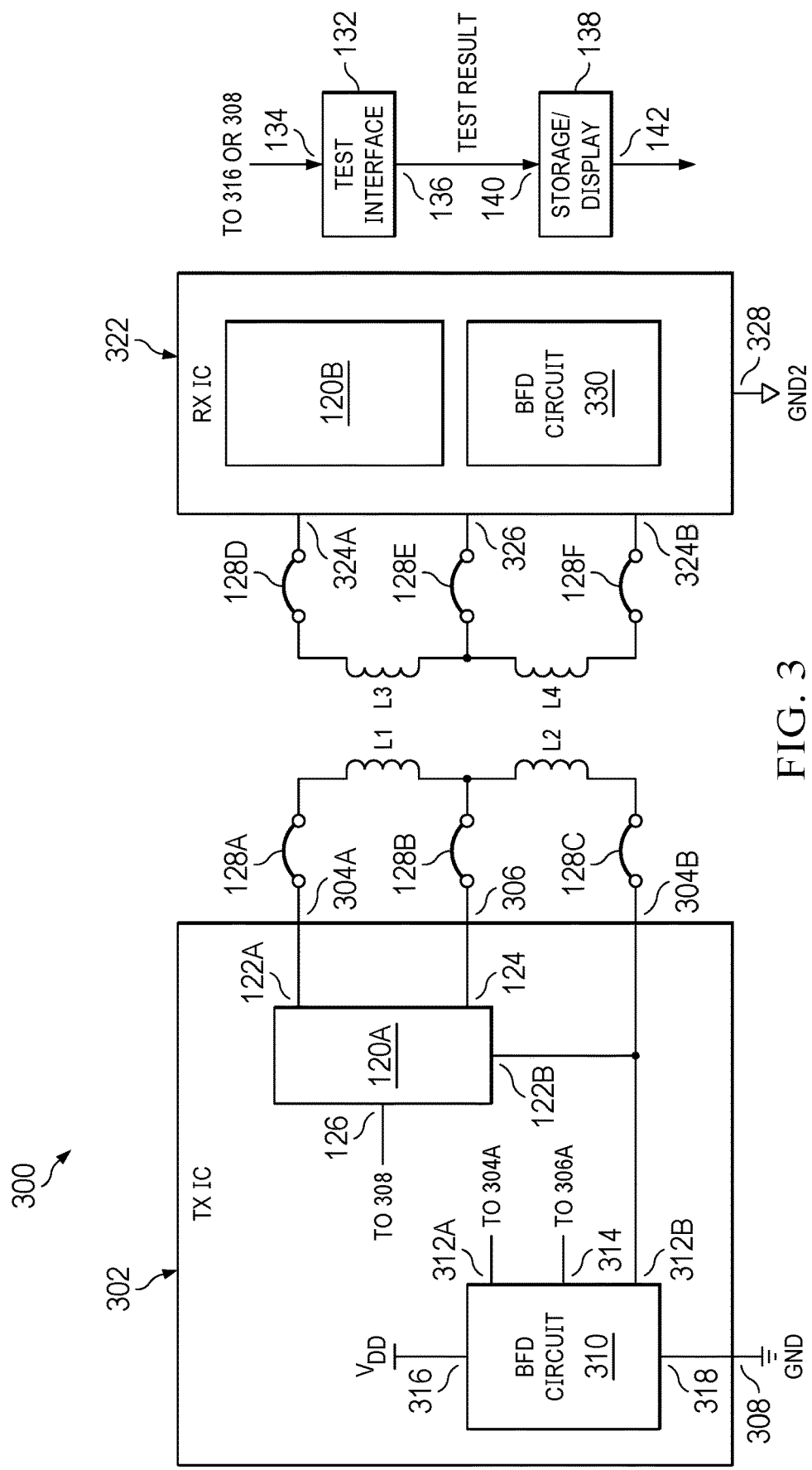
FIG. 3 is a diagram showing an example system with a BFD circuit.

FIG. 3 is a diagram showing an example system 300. The system 300 includes a transmitter IC 302, a receiver IC 322, the test interface 132, and the storage/display unit 138. The system 300 also includes external inductors L1 to L4. Each of the inductors L1 to L4 has a first terminal and a second terminal. As shown, the inductors L1 and L2 are coupled to the transmitter IC 302, while the inductors L3 and L4 are coupled to the receiver IC 322. Also, bondwires 128A to 128C couple the inductors L1 and L2 to the transmitter IC 302, and bondwires 128D to 128F couple the inductors L3 and L4 to the receiver IC 322. In some examples, the transmitter IC 302, the receiver IC 322, the bondwires 128A to 128F, and the inductors L1 to L4 are components of an MCM or another multi-chip package.

In the example of FIG. 3, the transmitter IC 302 has a first terminal 304A, a second terminal 304B, a third terminal 306, and a ground terminal 308. In some examples, the transmitter IC 302 also has a power terminal (not shown) comparable to the third terminal 107 in FIGS. 1 and 2. The transmitter IC 302 includes a BFD circuit 310 and communication circuitry 120A. The communication circuitry 120A is an example of the communication circuitry 120 in FIGS. 1 and 2. In the example of FIG. 3, the BFD circuit 310 has a first terminal 312A, a second terminal 312B, a third terminal 314, a fourth terminal 316, and a ground terminal 318. The communication circuitry 120A has first terminals 122A and 122B, a second terminal 124, and a ground terminal 126. The terminal 316 of the BFD circuit 310 is coupled to a supply voltage terminal to receive the supply voltage $V_{DD}$. The ground terminal 318 of the BFD circuit 310 and the ground terminal 126 of the communication circuitry 120A are coupled to the ground terminal 308 of the TX IC 102A to be electrically grounded.

In the example of FIG. 3, the receiver IC 322 has a first terminals 324A and 324B, a second terminal 326, and a ground terminal 328 (that is electrically grounded). In some examples, the receiver IC 322 also has a power terminal (not shown) comparable to the third terminal 107 in FIGS. 1 and 2. The receiver IC 322 includes a BFD circuit 330 and communication circuitry 120B. The communication circuitry 120B is an example of the communication circuitry 120 in FIGS. 1 and 2. In the example of FIG. 3, the BFD circuit 330 may have terminals (not shown) similar to the terminals described for the BFD circuit 310 of the transmitter IC 302. The communication circuitry 120B may have terminals (not shown) similar to the terminals described for the communication circuitry 120A.

In the example of FIG. 3, the first terminal of the inductor L1 is coupled to the first terminal 304A of the transmitter IC 302. The first terminal of the inductor L2 is coupled to the second terminal 304B the transmitter IC 302. The second terminals of the inductors L1 and L2 are coupled to the third terminal 306 of the transmitter IC 302. The first terminal 304A of the transmitter IC 302 is coupled to the first terminal 122A of the communication circuitry 120A and to the first terminal 312A of the BFD circuit 310. The second terminal 304B of the transmitter IC 302 is coupled to the first terminal 122B of the communication circuitry 120A and to the second terminal 312B of the BFD circuit 310. The third terminal 306 of the transmitter IC 302 is coupled to the second terminal 124 of the communication circuitry 120A and to the third terminal 314 of the BFD circuit 310. The ground terminal 308 of the transmitter IC 302 is coupled to the ground terminal 126 of the communication circuitry 120A and to the ground terminal 318 of the BFD circuit 310.

In the example of FIG. 3, the first terminal of the inductor L3 is coupled to the first terminal 324A of the receiver IC 322. The first terminal of the inductor L4 is coupled to the second terminal 324B of the receiver IC 322. The second terminals of the inductors L3 and L4 are coupled to the second terminal 326 of the receiver IC 322. In some examples, the first terminal 324A of the receiver IC 322 is coupled to a first terminal (not shown) of the communication circuitry 120B and to a first terminal (not shown) of the BFD circuit 330. The second terminal 324B of the receiver IC 322 is coupled to a second terminal (not shown) of the communication circuitry 120B and to a second terminal of the BFD circuit 330. The second terminal 326 of the receiver IC 322 is coupled to a third terminal (not shown) of the communication circuitry 120B and to a third terminal (not shown) of the BFD circuit 330. The ground terminal 328 of the receiver IC 322 is coupled to a ground terminal (not shown) of the communication circuitry 120B and to a ground terminal (not shown) of the BFD circuit 330. The test interface 132 and the storage/display unit 138 were described in FIG. 1 and have the same description in FIG. 3.

With the system 300, tests may be performed for the transmitter IC 302 after the bondwires 128A to 128C are presumed to be in their respective positions. In some examples, the test interface 132 operates to: receive an amount of current flow at the fourth terminal 316 or the ground terminal 318 of the BFD circuit 310 at its input 134 while $V_{DD}$ or a test signal is applied to the fourth terminal 316 of the BFD circuit 310; if the amount of current flow is less than a threshold, identify that there is no bondwire fault; if the amount of current flow is greater than the threshold, identify that there is a bondwire fault; and provide a test result at its output 136. The test result options and the operations of the storage/display unit 138 may be the same as described in FIG. 1.

With the system 300, tests may be also performed for the receiver IC 302 after the bondwires 128D to 128F are presumed to be in their respective positions. In some examples, the test interface 132 operates to: receive an amount of current flow at a fourth terminal (not shown) or a ground terminal (not shown) of the BFD circuit 330 at its input 134 while $V_{DD}$ or a test signal is applied to the fourth terminal of the BFD circuit 330; if the amount of current flow is less than a threshold, identify that there is no bondwire fault; if the amount of current flow is greater than the threshold, identify that there is a bondwire fault; and provide a test result at its output 136. The test result options and the operations of the storage/display unit 138 may be the same as described in FIG. 1.

With the BFD circuits 310 and 330, and with the operations of the test interface 132, detection of bondwire faults is facilitated. If no bondwire fault is detected, the transmitter IC 302, the receiver IC 322, or a related device may be subject to further tests (e.g., to test the communication circuitry 120A and 120B). In some examples, testing of the communication circuitry 120A and 120B and bondwire fault testing are performed by the test interface 132. Once all tests are completed and indicate proper functionality, the transmitter IC 302, the receiver IC 322, and/or a related device may be sorted as a functional device for inventory. If a bondwire fault is detected, the transmitter IC 302, the receiver IC 322, or a related device may be subject to further tests, may be subject to repair, or may be discarded. In some examples, the BFD circuit 310 and the BFD circuit 330 have the switch and switch controller topology described for the BFD circuit 110A in FIG. 2

Figure 4:
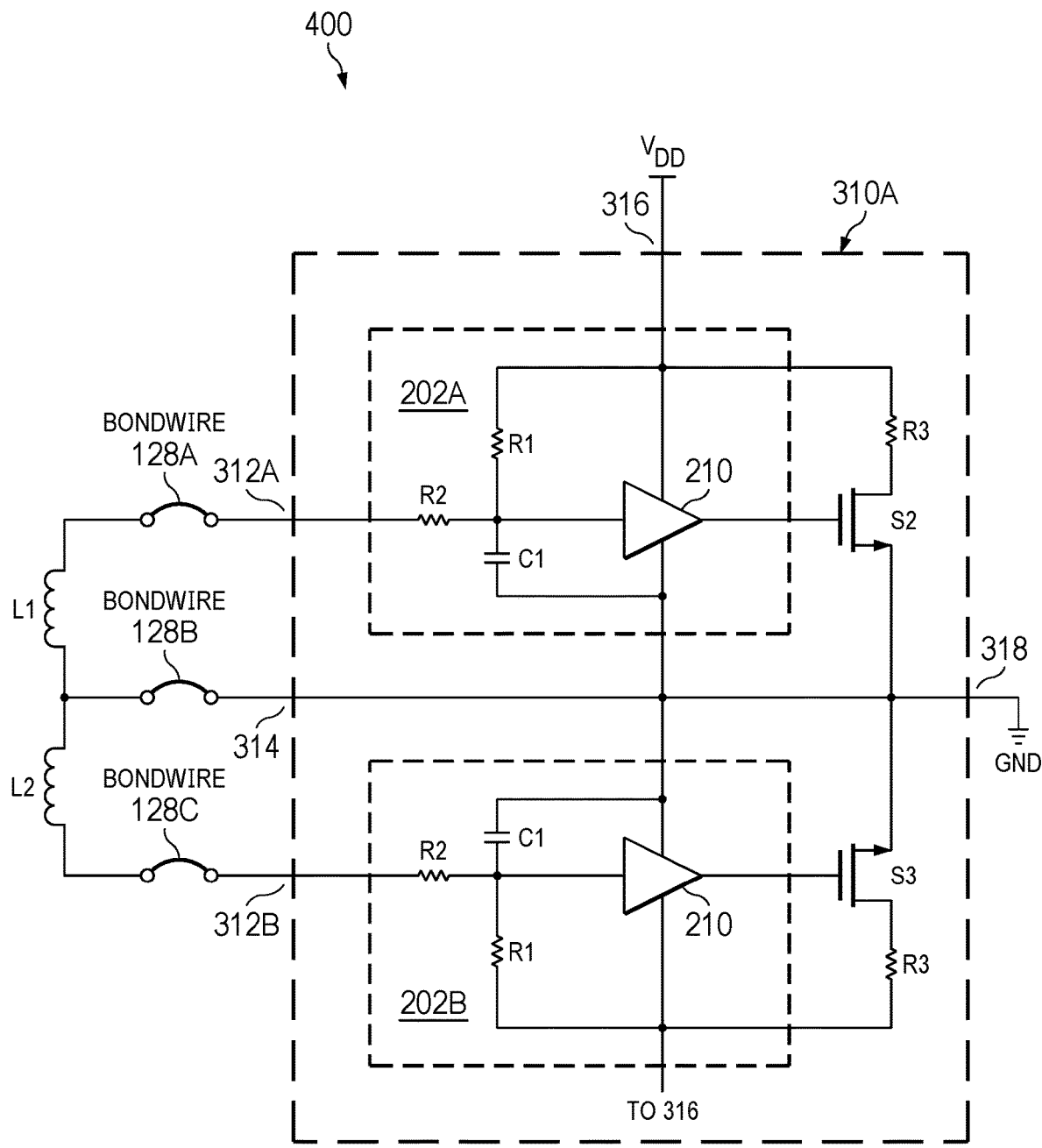
FIG. 4 is a schematic diagram showing an example circuit with a BFD circuit.

FIG. 4 is a schematic diagram showing an example circuit 400. The circuit 400 includes a BFD circuit 310A. The BFD circuit 310A is an example of the BFD circuit 310 in FIG. 3. In the example of FIG. 4, the external inductors L1 and L2 are coupled to the BFD circuit 310A via the bondwires 128A to 128C. As shown, the BFD circuit 310A includes a switch S2 and a switch controller 202A for the switch S2. The BFD circuit 310A also includes a switch S3 and a switch controller 202B for the switch S3. As shown, each of the switch controllers 202A and 202B has the same topology as the switch controller 202 described in FIG. 2. As an option, the BFD circuit 310A includes the resistor R3 between the fourth terminal 316 and the switch S2. As another option, the BFD circuit 310A includes the resistor R3 between the fourth terminal 316 and the switch S3. In the example of FIG. 4, the switches S2 and S3 is implemented by FETs and, in particular, n-channel metal-oxide semiconductor FETs.

In operation, a test interface (e.g., the test interface 132 herein) uses the BFD circuit 310A to detect whether the bondwires 128A to 128C are missing or faulty. In some examples, each of the switch controllers 202A and 202B performs the same or similar operations as the switch controller 202 of FIG. 2. As desired, the circuit 400 may include additional external components and related bondwires. The bondwires related to each external component may be described as bondwire conduction loops. In the example of FIG. 4, the bondwires 128A and 128B are part of first bondwire conduction loop for the inductor L1. Also, the bondwires 128C and 128B are part of second bondwire conduction loop for the inductor L2. For each bondwire conduction loop, the BFD circuit 310A includes a separate switch and switch controller. As desired, the number of switches and switch controllers for the BFD circuit 310A may vary to support fault detection for each bondwire conduction loop.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component and/or a conductor. In particular, a "bondwire" terminal is referred to as a terminal, e.g., a conductor to which a bondwire is or can be electrically connected.

A circuit or device described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") such as an NFET or a PFET, a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control terminal and its first and second terminals. In the context of a FET, the control terminal is the gate, and the first and second terminals are the drain and source. In the context of a BJT, the control terminal is the base, and the first and second terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A circuit comprising:
    a switch having first and second terminals and a control terminal, the first terminal coupled to a voltage supply terminal, the second terminal coupled to a ground terminal and to a first bondwire terminal; and
    a switch controller including:
        a first resistor having a first terminal and a second terminal, the first terminal of the first resistor coupled to a second bondwire terminal;
        a second resistor having a first terminal and a second terminal, the first terminal of the second resistor coupled to the voltage supply terminal, the second terminal of the second resistor coupled to the second terminal of the first resistor;
        a capacitor having a first terminal and a second terminal, the first terminal of the capacitor coupled to the ground terminal and to the first bondwire terminal, the second terminal of the capacitor coupled to the second terminals of the first and second resistors; and
        a buffer circuit having first, second, and third terminals and an output terminal, the first terminal of the buffer circuit coupled to the voltage supply terminal, the second terminal of the buffer circuit coupled to the second terminals of the capacitor and the first and second resistors, the third terminal of the buffer circuit coupled to the ground terminal and to the first bondwire terminal, the output terminal of the buffer circuit coupled to the control terminal of the switch.

2. The circuit of claim 1, wherein the switch comprises an n-channel field-effect transistor.

3. The circuit of claim 1, further comprising a third resistor having a first terminal coupled to the first terminal of the switch, and having a second terminal coupled to the voltage supply terminal.

4. The circuit of claim 1, further comprising an inductor coupled between the first and second bondwire terminals.

5. The circuit of claim 1, further comprising a resistor coupled between the first and second bondwire terminals.

6. The circuit of claim 1, further comprising an interface coupled to the voltage supply terminal or the ground terminal and configured to receive an indication of a fault at one or both of the first and second bondwires.

7. The circuit of claim 1, further comprising communication circuitry having a first terminal coupled to the first bondwire terminal, having a second terminal coupled to the second bondwire terminal, and having a third terminal coupled to the ground terminal.

8. The circuit of claim 7, wherein the communication circuitry comprises transmitter circuitry.

9. The circuit of claim 7, wherein the communication circuitry comprises receiver circuitry.

10. A circuit comprising:
    a first switch having first and second terminals and a control terminal, the first terminal of the first switch coupled to a voltage supply terminal, the second terminal of the first switch coupled to a ground terminal and to a first bondwire terminal; and
    a first switch controller including:
        a first resistor having a first terminal and a second terminal, the first terminal of the first resistor coupled to a second bondwire terminal;
        a second resistor having a first terminal and a second terminal, the first terminal of the second resistor coupled to the voltage supply terminal, the second terminal of the second resistor coupled to the second terminal of the first resistor;
        a first capacitor having a first terminal and a second terminal, the first terminal of the first capacitor coupled to the ground terminal and to the first bondwire terminal, the second terminal of the first capacitor coupled to the second terminals of the first and second resistors;
        a first buffer circuit having first, second, and third terminals and an output terminal, the first terminal of the first buffer circuit coupled to the voltage supply terminal, the second terminal of the first buffer circuit coupled to the second terminals of the first capacitor and the first and second resistors, the third terminal of the first buffer circuit coupled to the ground terminal and to the first bondwire terminal, the output terminal of the first buffer circuit coupled to the control terminal of the first switch;
    a second switch having first and second terminals and a control terminal, the first terminal of the second switch coupled to the voltage supply terminal, the second terminal of the second switch coupled to the ground terminal and to the first bondwire terminal; and
    a second switch controller including:
        a third resistor having a first terminal and a second terminal, the first terminal of the third resistor coupled to a third bondwire terminal;
        a fourth resistor having a first terminal and a second terminal, the first terminal of the fourth resistor coupled to the voltage supply terminal, the second terminal of the fourth resistor coupled to the second terminal of the first third;
        a second capacitor having a first terminal and a second terminal, the first terminal of the second capacitor coupled to the ground terminal and to the first bondwire terminal, the second terminal of the second capacitor coupled to the second terminals of the third and fourth resistors; and
        a second buffer circuit having first, second, and third terminals and an output terminal, the first terminal of the second buffer circuit coupled to the voltage supply terminal, the second terminal of the second buffer circuit coupled to the second terminals of the second capacitor and the third and fourth resistors, the third terminal of the second buffer circuit coupled to the ground terminal and to the first bondwire terminal, the output terminal of the second buffer circuit coupled to the control terminal of the second switch.

11. The circuit of claim 10, wherein the first and second switches comprise n-channel field-effect transistors (FETs).

12. The circuit of claim 10, further comprising a fifth and sixth resistors, the fifth resistor having a first terminal coupled to the first terminal of the first switch, the fifth resistor having a second terminal coupled to the voltage supply terminal, the sixth resistor having a first terminal coupled to the first terminal of the second switch, and the sixth resistor having a second terminal coupled to the voltage supply terminal.

13. The circuit of claim 10, further comprising first and second inductors, the first inductor coupled between the first and second bondwire terminals, and the second inductor coupled between the first and third bondwire terminals.

14. The circuit of claim 10, further comprising first and second resistors, the first resistor coupled between the first and second bondwire terminals, and the second resistor coupled between the first and third bondwire terminals.

15. The circuit of claim 10, further comprising an interface coupled to the voltage supply terminal or the ground terminal and configured to receive an indication of a fault at one or both of the first and second bondwires.

16. A circuit comprising:
a switch having a control terminal; and
a switch controller having a buffer circuit, the buffer circuit further including:
a first terminal configured to be coupled to a supply voltage;
a second terminal coupled to a second terminal of a first resistor, a first terminal of the first resistor adapted to be coupled to a bondwire; and
an output terminal connected to the control terminal of the switch, wherein the switch controller configured to provide a control signal at the output terminal of the buffer circuit responsive to a condition of the bondwire.

17. The circuit of claim 16, wherein the switch controller includes:
a second resistor having a first terminal and a second terminal, the first terminal of the second resistor coupled to the first terminal of the buffer, and the second terminal of the second resistor coupled to the second terminal of the first resistor; and
a capacitor having a first terminal and a second terminal, the first terminal of the capacitor coupled to the second terminals of the first and second resistors.

18. The circuit of claim 17, wherein the second terminal of the buffer circuit is coupled to the first terminal of the capacitor, and the output terminal of the buffer circuit coupled to a switch controller output.

19. The circuit of claim 16, wherein the buffer circuit is configured to:
provide a signal with a first state at the output terminal of the buffer circuit responsive to the current level being less than a threshold; and
provide the signal with a second state at the output terminal of the buffer circuit responsive to the current level being more than the threshold.

20. The circuit of claim 19, further comprising a test interface having a test interface input and a test interface output, the test interface input coupled to the first terminal of the buffer circuit, and the test interface configured to provide a bondwire fault signal at the test interface output responsive to detecting the current level is less than the threshold.

* * * * *